(12) United States Patent
Degani et al.

(10) Patent No.: US 7,692,511 B2
(45) Date of Patent: Apr. 6, 2010

(54) COMPACT BALUN TRANSFORMERS

(75) Inventors: Yinon Degani, Highland Park, NJ (US); Yu Fan, Dallas, TX (US); Charley Chunlei Gao, Plano, TX (US); Kunquan Sun, Plano, TX (US); Liguo Sun, Plano, TX (US); Jian Cheng, Anhui (CN)

(73) Assignee: Sychip Inc., Plano, TX (US)

( * ) Notice: Subject to any disclaimer, the term of this patent is extended or adjusted under 35 U.S.C. 154(b) by 96 days.

(21) Appl. No.: 12/077,811

(22) Filed: Mar. 21, 2008

(65) Prior Publication Data

US 2009/0237175 A1    Sep. 24, 2009

(51) Int. Cl.
*H03H 7/42* (2006.01)
*H01P 3/08* (2006.01)

(52) U.S. Cl. .......................................... 333/25; 333/238

(58) Field of Classification Search .................... 333/25, 333/26, 238; 336/200
See application file for complete search history.

(56) References Cited

U.S. PATENT DOCUMENTS 6,801,114 B2 * 10/2004 Yang et al. ................... 336/200
7,164,339 B2 *  1/2007 Huang ......................... 336/200

* cited by examiner

*Primary Examiner*—Dean O Takaoka
(74) *Attorney, Agent, or Firm*—Peter V. D. Wilde

(57) ABSTRACT

Balun transformers are described wherein multiple transformer loops are implemented in a stacked design with the primary and secondary loops overlying one another. By aligning the loops in a vertical direction, instead of offsetting the loops, the area of the device is reduced. Multiple transformer loops are nested on each level, and the transformer loops on a given level are connected together using a crossover located on a different level.

17 Claims, 7 Drawing Sheets

US 7,692,511 B2

COMPACT BALUN TRANSFORMERS

FIELD OF THE INVENTION

This invention relates to balun transformers, and more specifically to compact balun transformers implemented in thin film multi-loop configurations

BACKGROUND OF THE INVENTION

Balanced/unbalanced transformers (baluns) are a key component of double-balanced mixer and push-pull amplifier designs in wireless systems. They provide balanced outputs from an unbalanced input. Balanced output for wireless applications requires half the input signal amplitude at each of two output terminals, 180 degrees out of phase with each other. In principle, conventional coil transformer designs using wire wound coils, can produce this result. However, conventional wire wound devices have an upper frequency limit of several hundred megahertz due to magnetic flux leakage and capacitive coupling between the windings. Current wireless applications require very high frequency operation at low power. Active balun designs provide high frequency but operate with high DC power consumption. Passive baluns are therefore preferred. Of the known passive balun designs, Marchand type devices have become the device of choice for wireless applications. They provide excellent balance and can be made in small, easily integrated, geometries. A preferred Marchand balun, from the standpoint of miniaturization, is the spiral coil type. A version of the spiral Marchand balun has been reported by T. Gokdemir et al., IEEE MTT-S Int'l Microwave Symp. Dig., pp. 401-404. They implemented the spiral balun using GaAs MMIC technology and two side-by-side spiral microstrip lines.

Chen et al. have also reported monolithic passive balun designs using meandered line configurations. See Chen et al., "Broadband Monolithic Passive Baluns and Monolithic Double-Balanced Mixer", IEEE Trans. Microwave Theory Tech., Vol. 39, No. 12, pp. 1980-1991. These designs have "rectangular spiral" configurations with air bridges to access the strip lines.

A more compact balun design is described in U.S. Pat. No. 6,097,273, issued Aug. 1, 2000. This design uses a thin film stack of spiral loops with multiple loops on different planes in an offset but overlying relationship.

U.S. Pat. No. 6,396,362 describes balun transformers on a conventional integrated circuit substrate pointing out the problems associated with implementing multi-level balun devices using integrated circuit technology.

There continues to be a need for high frequency, low power, baluns that are compact and can be easily and efficiently integrated.

BRIEF STATEMENT OF THE INVENTION

According to one aspect of the invention, balun transformers with multiple transformer loops are implemented in a stacked design with the primary and secondary loops overlying one another. By aligning the loops in a vertical direction, instead of offsetting the loops, the area of the device is reduced. According to another aspect of the invention, multiple transformer loops are nested on each of multiple (at least two) levels, and the transformer loops on a given level are connected together using a crossover located on a different level.

BRIEF DESCRIPTION OF THE DRAWING

The invention may be better understood when considered in conjunction with the drawing in which.

DETAILED DESCRIPTION OF THE INVENTION

Figure 1:
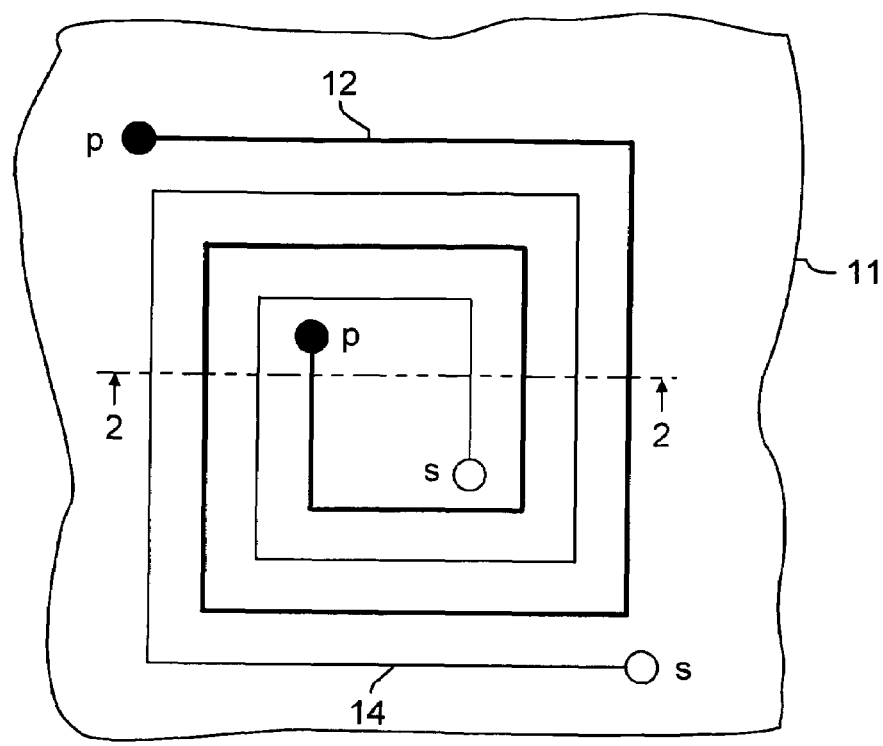
FIG. 1 illustrates a common prior art balun configuration using interleaved primary and secondary loops.
Figure 2:
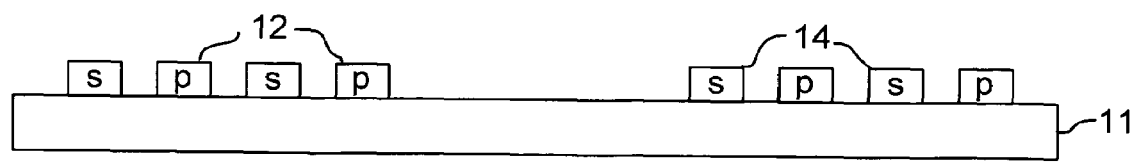
FIG. 2 is a section view through 2-2 of FIG. 1.

With reference to FIG. 1, a conventional balun structure is shown with the primary loop runners 12 and the secondary loop runners 14 formed side-by-side on substrate 11. FIG. 2 is a view through section 2-2 of FIG. 1.

Figure 3:
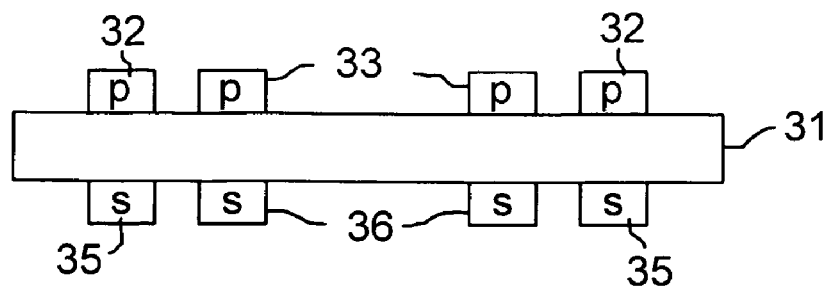
FIG. 3 shows an alternative arrangement wherein the primary and secondary loops are located on different sides of a substrate.

FIG. 3 represents an alternative balun structure showing outer loop runner 32 and inner loop runner 33 that comprise the primary loops, and outer loop runner 35 and inner loop runner 36 that comprise the secondary loops, formed on opposite surfaces of substrate 31. It is evident that the lateral area of the balun of FIG. 3 is smaller than the area of the balun of FIGS. 1 and 2. However, in many cases it is not possible or not efficient from the standpoint of cost or performance, to use both sides of a device substrate.

Figure 4:
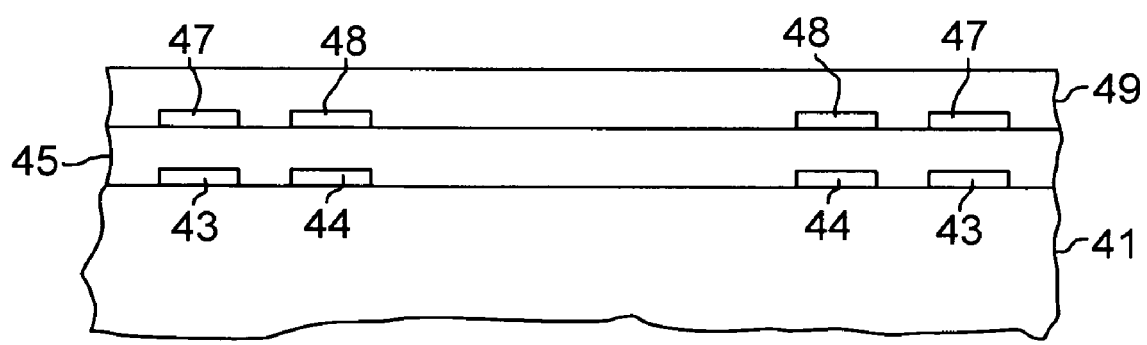
FIG. 4 illustrates a stacked loop configuration wherein the loops are aligned in a vertical direction in accordance with one aspect of the invention.

FIG. 4 represents an embodiment according to the invention wherein the primary and secondary loops are stacked on one side of the substrate. The substrate 41 is preferably part of a large Integrated Passive Device (IPD) substrate. The IPD substrate may support a larger number of devices such as inductors, capacitors, resistors. The substrate may be selected from a variety of substrates and substrate materials. It may comprise silicon, polysilicon, ceramic, FR4 epoxy board, etc. The substrate may be coated with a dielectric layer such as silicon dioxide or polyimide. One metal level shown in FIG. 4 comprises secondary loop runners 43 and 44. This metal level will be referred to here as metal 1. However, it is understood by those skilled in the art that the IPD may comprise several levels and a balun may be built starting with the first or any subsequent metal level. The loop runners may be created by conventional methods. The metal used in the device may be any suitable conductive metal, e.g., Al, Ag, Au, Sn, Ta, Ti, Pd, or alloys thereof, but preferably is Cu. Layer 45 is an interlevel dielectric and may comprise any suitable insulating material, such as silicon dioxide, silicon nitride, etc. Preferably, layer 45 is a polymer such as polyimide. Other insulating polymers, such as hydrocarbon polymers, PVC, epoxy, epoxy acrylates, photoresist materials, etc. may be used. To minimize capacitive coupling between coils, layer 45 should be relatively thick, e.g., greater than 2 microns, and preferably greater than 4 microns. Accordingly, it is efficient to use polymer materials for this layer since they can be applied by spin-on or similar deposition techniques that form essentially conformal, thick, layers easily and quickly. Typically these are in the range 5-9 microns.

The second level metal, metal 2, preferably is the same metal as level 1, and, in the embodiment shown, comprises primary loop runners 47 and 48. In alternative embodiments level 1 may comprise the primary loop runners and level 2 the secondary loop runners.

A characteristic feature of the invention is that the primary and secondary loop runners are essentially aligned in the vertical direction (z-direction). "Essentially aligned" is intended to mean that, in plan view, the loop runners at least partially overlap, although not necessarily in precise vertical alignment. This arrangement minimizes the area of the balun in the x-y plane. This is in contrast with prior art designs in which the loop runners are formed side-by-side, or the stacked designs wherein the loop runners at different levels are offset in the x-y directions.

The specific dimensions of the loop runners may very considerably, depending on the device characteristics required. Guidance on dimensions is given in the application referenced earlier, U.S. Pat. No. 6,097,273, issued Aug. 1, 2000, which is incorporated herein by reference. Typically the loop runners will have a thickness of 0.5 to 5.0 microns, a spacing of 5-20 microns and a width of 5-30 microns. In this connection it is mentioned that the drawing is not to scale.

Figure 5:
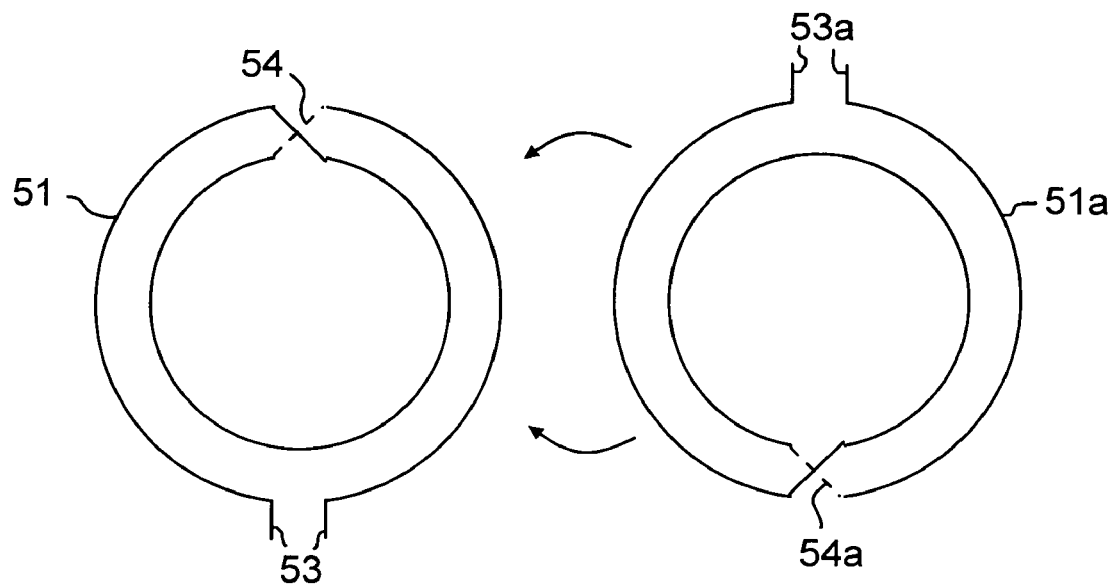
FIG. 5 is schematic plan view representation of the two levels shown in FIG. 4.

FIG. 5 shows schematically a primary loop runner 51 and a secondary loop runner 51*a* according to a preferred embodiment of the invention. The loop runners comprise I/O terminals 53 and 53*a*. The loop runners have an inner loop runner and an outer loop runner as shown. The loop runners cross at 54 and 54*a*, where a crossover structure is provided as explained in more detail below. The crossover arrangement whereby nested loop runners are interconnected, forms another aspect of the invention. When assembled in the balun device, the two loop conductors will be superimposed as suggested by the arrows. FIG. 5 shows two loop runners for each of the primary and secondary coils of the balun. A single loop runner or more than two loop runners, or even fractions of loop runners, may be used.

Figure 6:
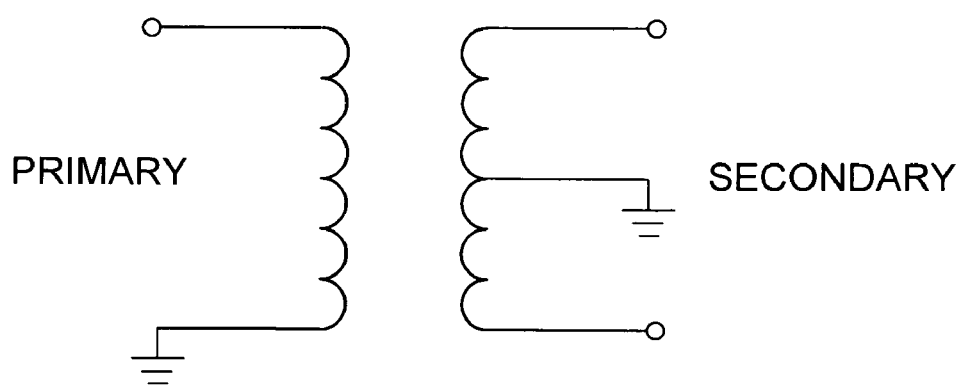
FIG. 6 is circuit diagram showing a balun embodiment with a split secondary, which is an electrical representation of the embodiment shown in FIGS. 7-9.

FIG. 6 is a circuit schematic showing a balun with a split secondary, i.e. with a 2:1 transformer ratio. This example will be used for the illustrative embodiment shown in FIGS. 7-9. Other transformer ratios may be realized by simply choosing the location of the grounded tap along the loop runner.

Figure 7A:
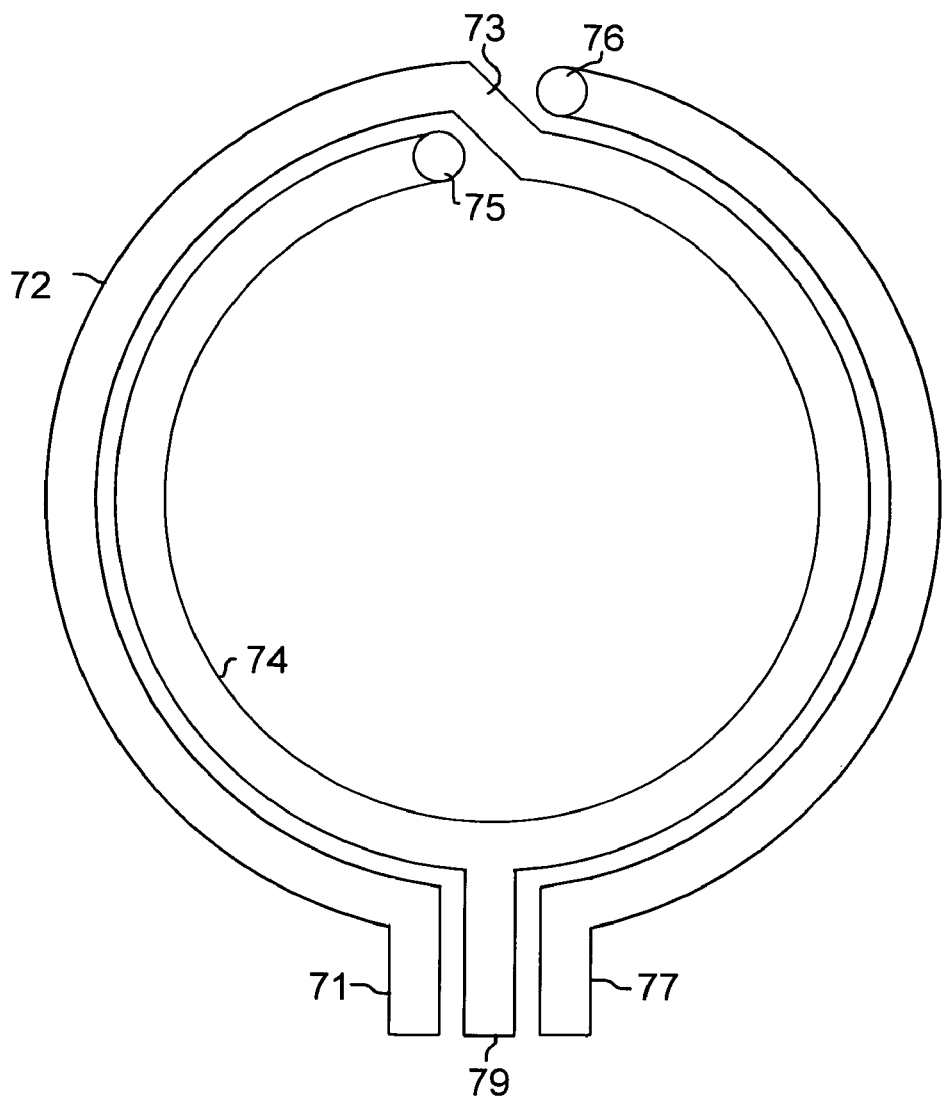
FIGS. 7A and 7B are schematic plan views of the metal 1 level of a multilevel balun device of the invention showing the secondary loops of the balun.

FIG. 7A is a schematic representation of a balun transformer secondary for the circuit of FIG. 6. The pattern shown is a portion of metal level 1 in a larger IPD. The I/O terminals for the secondary loops are shown at 71 and 77. The loop runner begins at 71, traces an outer loop path 72 to a bridge 73 connecting the outer loop 72 to an inner loop 74. The inner loop runner ends at via 75, which comprises part of a crossover interconnection that connects the inner and outer loops. The crossover is implemented using another level, level 2 in this example, as will be explained below. The other via for the crossover, on the outer loop and the outer side of bridge 73, is shown at 76. From via 76, the loop runner traces the outer loop to I/O terminal 77. The split secondary is implemented using tap 79, comprising a runner/terminal placed in between the I/O terminal portions 71 and 77. As is evident, tap 79 essentially splits the secondary into two approximately equal parts. Alternatively, a tap at any place along the loop runner 74 can be implemented using a crossover of the kind just described. Following yet another alternative, a tap anywhere on outer loop 72 can be made without using a crossover.

It should be noted that bridge connection 73 and the crossover between vias 75 and 76 can be interchanged.

The loop runner configuration shown in FIG. 7A is circular as shown. However, other shapes may be substituted to form one or more turns for the loop. For the purpose of defining the invention a loop is defined as a partly open curve that extends through at least 300 degrees. FIG. 7A shows a double loop that extends through nearly 720 degrees. If implemented in a square configuration, a single loop would extend through four corners, or 360 degrees.

Figure 7B:
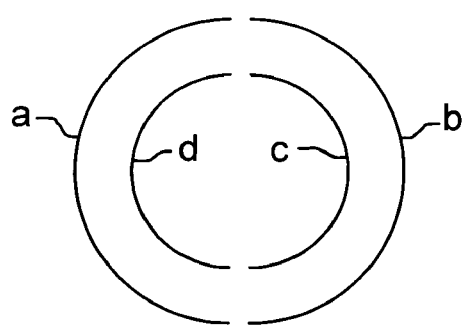

The loop pattern of FIG. 7A can be described, in general terms, as having two loops, an inner loop and an outer loop. The nomenclature used here is illustrated in FIG. 7B. Each loop comprises two segments, four segments in all: a first outer loop segment (a in FIG. 7B), a second outer loop segment (b in FIG. 7B), a first inner loop segment (c in FIG. 7B), and a second inner loop segment (d in FIG. 7B). Each of the four loop segments is nominally semi-circular, and each has an input end and an output end. The loop segments may be semi-circles, but may have shapes approximating, or equivalent to, semi-circles as will be described in more detail below. Continuing with this descriptive mode, the secondary of the balun comprises four loop segments arranged as follows: the first outer loop segment with the input being the input of the balun secondary; the first inner loop segment with the input connected to the output of the first outer loop segment; the second inner loop segment with the input connected to the output of the first inner loop segment; the second outer loop segment with the input connected to the output of the second inner loop segment and the output being the output of the balun secondary.

The secondary of the balun shown in FIG. 7A additionally has a conductive output runner connected to the connection between the first and second inner loop segments. It also has a via connected to the output of the second inner loop segment, and a via connected to the input of the second outer loop segment. As mentioned above, the vias can be connected at the output of the first outer loop segment and the input of the second inner loop segment.

Figure 8:
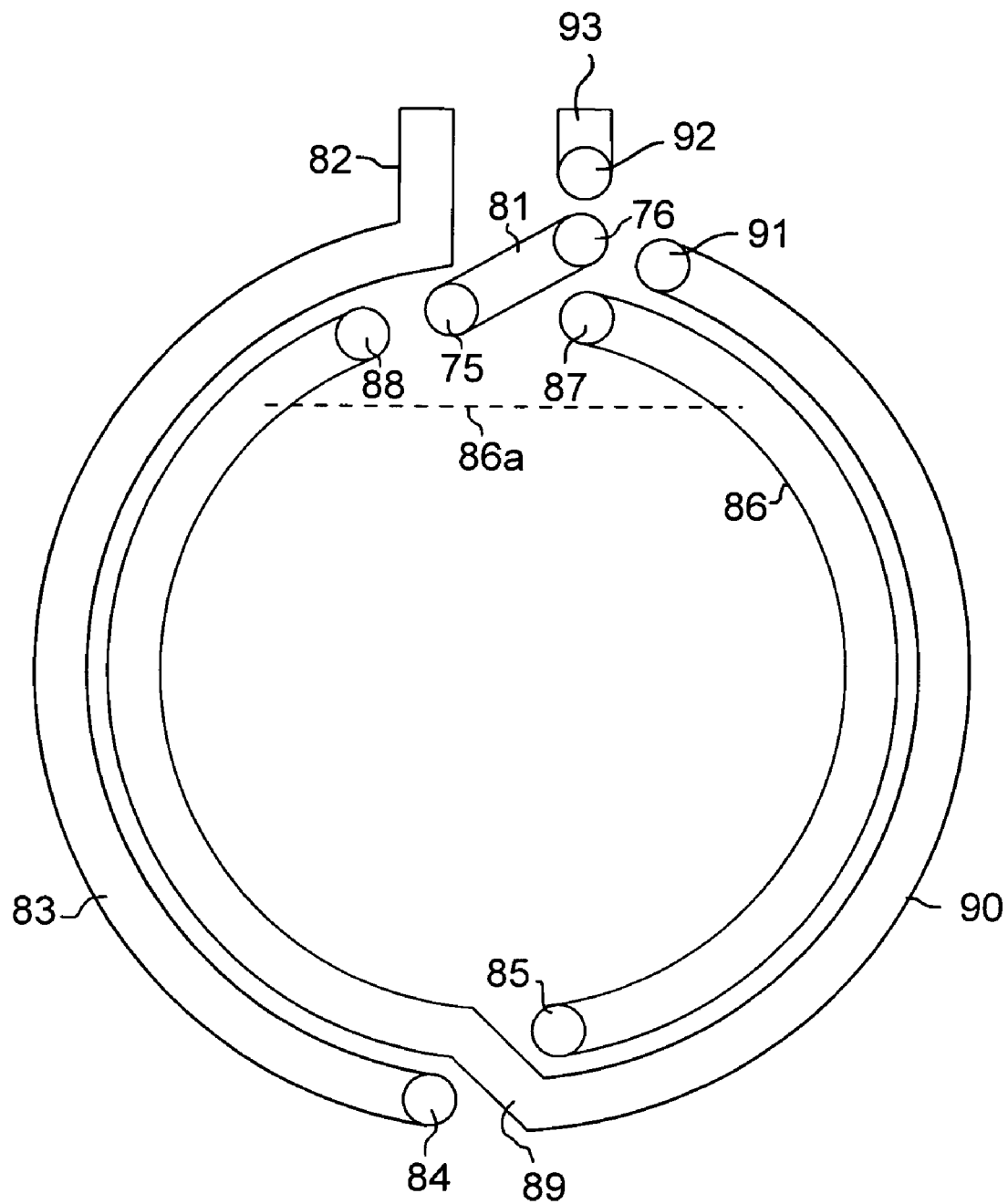
FIG. 8 is a schematic plan view of the metal 2 level of a multilevel balun device of the invention showing the primary loops of the balun.

FIG. 8 shows the pattern that comprises metal level 2, for the primary of the balun of FIG. 6. Again, the pattern shown is a portion of a larger metal pattern that forms the second (or another) metal level of an IPD. It will be recognized that the pattern for this portion of metal level 2 is similar to the pattern of FIG. 7A but rotated around a horizontal axis. That rotation leaves the I/O terminals 82 and 93 at the top of the figure and a crossover at the bottom of the figure. The crossover connecting vias 75 and 76 of FIG. 7A is shown at 81 in FIG. 8. The loop runner in FIG. 8 traces from I/O terminal 82, around outer loop 83 to crossover via 84, then to another level, and then back to level 2 at via 85. From there the loop runner traces the inner loop 86 to crossover via 87. This crossover accommodates the space taken for crossover 81. The crossover is completed at via 88. From there the loop runner continues along inner loop 86 to bridge 89, where it crosses to outer loop 90, and connects to another crossover via 91. Crossover via 92 connects to I/O terminal runner 93. The crossover between vias 91 and 92 is completed on another level, which will be described in connection with FIG. 9.

Using a slightly different layout, the crossovers connecting vias 87 and 88 and 91 and 92 can be eliminated. For example, by spacing the loops further apart, the crossover between vias 87 and 88 could be eliminated. This crossover could also be eliminated by truncating a portion of the inner loop as suggested by the dotted line path 86*a*. However, since another interconnect level is needed in this embodiment for the crossover connecting the inner and outer loops, i.e. between vias 84 and 85, it is not inconvenient to form additional crossovers to implement the arrangement shown in FIGS. 7-9.

It should be noted that bridge 89 and the crossover between vias 84 and 85 can be interchanged.

Using the descriptive mode set forth above for the secondary of the balun, the primary of FIG. 8 may be described as also comprising four loop segments (as in FIG. 7B). The four loop segments of the primary are arranged as follows: the first outer loop segment with the input being the input of the balun primary, the first inner loop segment with the input connected to the output of the first outer loop segment, the second inner loop segment with the input connected to the output of the first inner loop segment, the second outer loop segment with the input connected to the output of the second inner loop segment and the output being the output of the balun primary. The primary in FIG. 8 additionally has a via connected to the output of the first outer loop segment, and a via connected to the input of the first inner loop segment. As mentioned above, the vias are interchangeable and can alternatively be connected to the output of the second inner loop segment and the input of the second outer loop segment.

Figure 9:
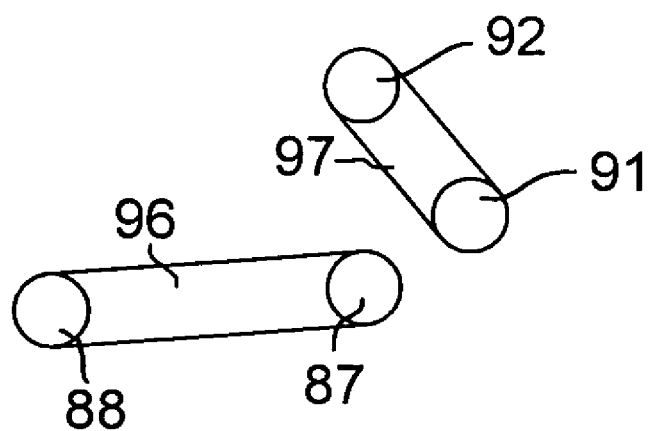
FIG. 9 is a schematic plan view of an additional metal level of a multilevel balun device of the invention showing interconnections for the primary loops.
Figure 9:
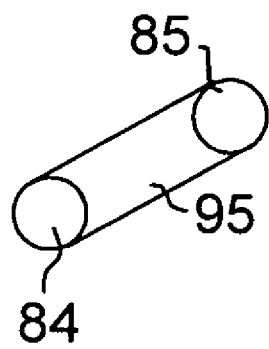

An interconnect pattern for completing the crossovers for the primary loop runner of FIG. 8 is shown in FIG. 9. The metal levels shown in FIGS. 7A and 8 would normally be contiguous levels, though not necessarily levels 1 and 2. The level shown in FIG. 9 could be the next adjacent level, in this example level 3, or could be another higher (or lower) level. The pattern of FIG. 9 has runner 95, connecting vias 84 and 85, and, if necessary, runners 96 and 97 connecting vias 87, 88 and 91, 92 respectively.

Figure 10A:
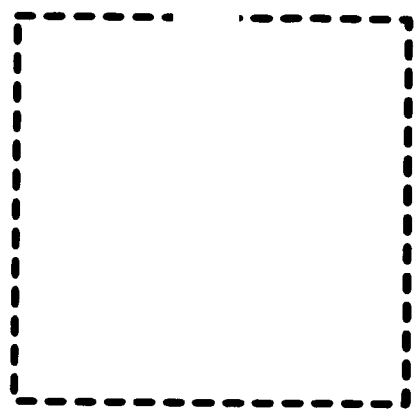
FIGS. 10A-C illustrate alternative loop shapes.
Figure 10B:
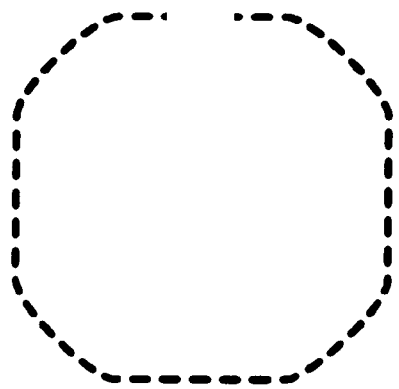
Figure 10C:
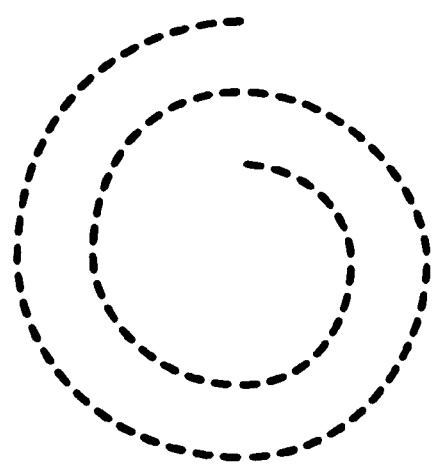

FIGS. 10A-10C represent alternative loop conductor patterns, as mentioned earlier. Patterns with square or sharp corners, like the one shown in FIG. 10A, are generally avoided due to undesirable field patterns that form at corners of a runner. Accordingly, for some applications the loop configuration of FIG. 10B may be preferred. The nominal shape of the loops in FIG. 10B can be described as square with rounded corners. The usual loop pattern, wherein the pattern has at least two loops, has one loop nested within another loop. In the configuration shown in FIGS. 7-9, the loops are circular, and the loop pattern has one loop concentrically formed within another loop, i.e. the circular loops share a common center. These are referred to as nested loops. However, in an alternative construction, shown in FIG. 10C, the loops may have a spiral configuration. An advantage of the spiral configuration is that a crossover interconnection between loops is not needed.

Reference made above, and in the appended claims, to "first", "second" etc. in connection with metallization levels or interlevel dielectric layers, is intended to convey a sequence, so the first metallization layer or level refers to the first in the recited sequence, and may or may not be the first layer or level in the device.

Reference to an insulating substrate is intended to mean that the surface of the substrate comprises insulating material. The surface may be the surface of a bulk insulating substrate, or may be a layer of insulating material covering the bulk substrate. The recited substrate may also be an insulating layer comprising an interlevel dielectric. In high performance IPDs it is usually important that the bulk material as well as any surface layers be insulating to prevent capacitive coupling between the balun windings and the substrate. U.S. Pat. No. 6,396,362, cited earlier, describes the problems associated with building multiple level baluns on an integrated circuit substrate. Typical integrated circuit substrates have a resistivity in the range 10-50 ohm cm. For balun devices made following the teachings of this invention the substrate resistivity should be above 200 ohm cm, and preferably above 500 ohm cm. If the bulk substrate is silicon, an adequately insulating substrate may be formed using a layer of insulator, silicon dioxide for example, with a thickness greater than 100 microns.

The metallization layers may be formed by either substractive or additive processing. The term selective deposition, or selectively depositing, is intended to refer to both.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An integrated passive device comprising a balun device having a multi-level structure of at least two levels, level one and level two, where the multi-level structure is situated in an essentially horizontal plane and comprises:
    (a) an insulating substrate with a resistivity greater than 200 ohm cm
    (b) a level one conductive runner formed on the substrate and having a loop pattern,
    (c) an interlevel dielectric layer covering the first conductive runner,
    (d) a level two conductive runner formed on the interlevel dielectric and having a loop pattern corresponding to the loop pattern of the first conductive runner,
    wherein the loop patterns of the level one and level two conductive runners are essentially in vertical alignment.

2. A balun device having a multi-level structure of at least two levels, level one and level two, where the multi-level structure is situated in an essentially horizontal plane and comprises:
    (a) an insulating substrate;
    (b) a level one conductive runner formed on the substrate and having a loop pattern,
    (c) an interlevel dielectric layer covering the first conductive runner the interlevel dielectric having a thickness of at least 2 microns,
    (d) a level two conductive runner formed on the interlevel dielectric and having a loop pattern corresponding to the loop pattern of the first conductive runner,
    wherein the loop patterns of the level one and level two conductive runners are essentially in vertical alignment.

3. The balun device of claim 2 wherein the loop patterns of the first and second conductive runners comprise at least two loops, with one loop nested inside another loop.

4. The balun device of claim 3 wherein the loops are circular loops, a larger loop and a smaller loop, and the loops have a common center.

5. The balun device of claim 3 wherein the loops are square with rounded corners.

6. The balun device of claim 3 wherein the loops have a spiral configuration.

7. The balun device of claim 3 wherein the loops on the first level are connected with a crossover connection on the second level.

8. The balun device of claim 7 wherein the loops on the second level are connected with a crossover connection on a third level.

9. The balun device of claim 2 wherein the level one and level two loops each have an input end and an output end, wherein the output end of the first loop is connected to the input end of the second loop.

10. An integrated passive device comprising a balun with a multi-level structure of at least three levels, level one, level two, and level three, where the multi-level structure is situated in an essentially horizontal plane and comprises:
   (a) an insulating substrate;
   (b) a level one conductive runner formed on the substrate the level one conductive runner having a loop pattern comprising at least two loops,
   (c) a first interlevel dielectric layer covering the level one conductive runner,
   (d) a level two conductive runner formed on the first interlevel dielectric layer the level two conductive runner having a loop pattern corresponding to the loop pattern of the level one conductive runner,
   (e) a level two crossover connection formed on the first interlevel dielectric layer connecting two loops of the level one conductive runner,
   (f) a second interlevel dielectric layer covering the level two conductive runner,
   (g) a level three crossover connection formed on the second interlevel dielectric layer connecting two loops of the level two conductive runner.

11. The integrated passive device of claim 10 wherein the loop patterns of the level one and level two conductive runners are essentially in vertical alignment.

12. A balun device comprising:
   a first metal level comprising a primary loop conductor, the primary loop conductor having at least two loops, an inner loop and an outer loop, wherein each loop comprises two segments and the inner and outer loops comprise four segments, a first outer segment, a second outer segment, a first inner segment, and a second inner segment, and wherein each of the four segments is nominally semi-circular, and each has an input end and an output end, the four segments arranged as follows:
      the first outer loop segment with the input being the input of the balun secondary,
      the first inner loop segment with the input connected to the out put of the first outer loop segment,
      the second inner loop segment with the input connected to the output of the first inner loop segment,
      the second outer loop segment with the input connected to the output of the second inner loop segment and the output being the output of the balun secondary,
   a second metal level comprising a secondary loop conductor having two loops, an inner loop and an outer loop, wherein each loop comprises two segments and the inner and outer loops comprise four segments, a first outer segment, a second outer segment, a first inner segment, and a second inner segment, and wherein each of the four segments is nominally semi-circular, and each has an input end and an output end, the four segments arranged as follows:
      the first outer loop segment with the input being the input of the balun primary,
      the first inner loop segment with the input connected to the output of the first outer loop segment,
      the second inner loop segment with the input connected to the output of the first inner loop segment,
      the second outer loop segment with the input connected to the output of the second inner loop segment and the output being the output of the balun secondary,
   wherein an inner loop segment and an outer loop segment of the primary conductor are connected with a crossover interconnection and said crossover interconnection is formed on said second level metal.

13. The balun device of claim 12 additionally including a via connected to the output of the second inner loop segment, and a via connected to the input of the second outer loop segment.

14. The balun device of claim 12 additionally including a via connected to the output of the first outer loop segment, and a via connected to the input of the second inner loop segment.

15. The balun device of claim 13 additionally including a crossover connecting the said vias.

16. The balun device of claim 14 additionally including a crossover connecting the said vias.

17. The balun device of claim 12 additionally including a conductive output runner connected to the connection between the first and second inner loop segments.

* * * * *